United States Patent [19]

Abramov et al.

[11] 4,209,746
[45] Jun. 24, 1980

[54] MAGNETIC FIELD GRADIENT MEASURING DEVICE

[76] Inventors: Jury M. Abramov, ulitsa Shkolnaya,4, kv. 55; Alexandr N. Kozlov, ulitsa Solnechnaya,4, kv. 61; Svetlana E. Sinelnikova, ulitsa Solnechnaya,4, kv. 68, all of Moskovskaya oblast, Akademgorodok, U.S.S.R.

[21] Appl. No.: 874,552

[22] Filed: Feb. 1, 1978

[51] Int. Cl.$^2$ ............................................. G01R 33/08
[52] U.S. Cl. .................................... 324/301; 324/304
[58] Field of Search ............... 324/0.5 R, 0.5 E, 0.5 F

[56] References Cited

U.S. PATENT DOCUMENTS

| | | | |
|---|---|---|---|
| 3,187,251 | 6/1965 | Bell | 324/0.5 F |
| 3,818,322 | 6/1974 | Hearn | 324/0.5 F |
| 3,863,144 | 1/1975 | Simpson | 324/0.5 E |
| 3,873,908 | 3/1975 | Young | 324/0.5 F |

Primary Examiner—M. Tokar
Attorney, Agent, or Firm—Haseltine, Lake & Waters

[57] ABSTRACT

Disclosure is made of a magnetic field gradient measuring device comprising two sensors arranged at points of a magnetic field which are to be investigated, and connected with their outputs to inputs of a phase detector. Each of the two sensors comprises an absorption cell filled with atoms of a working matter. Arranged at the input of said absorption cell is a light source intended for optical pumping of atoms of the working matter. At the output of said absorption cell there is arranged a photocell intended to register the beam of light passing through the cell. The cell itself is located inside a radio frequency coil energized with current of a variable frequency close to the magnetic transition resonance frequency of atoms of the working matter, which is determined by the magnetic field intensity at the sensor location. The coils are energized by a means common for both sensors.

6 Claims, 4 Drawing Figures

MAGNETIC FIELD GRADIENT MEASURING DEVICE

The present invention relates to devices for measuring parameters of magnetic field and, more particularly, to a magnetic field gradient measuring device. The invention is applicable to geophysics, where it can be used for detecting magnetic anomalies from board of aircraft. The invention can also be used for measuring the intensity of magnetization of rock and other substances, as well as for measuring the intensity of permanent and variable magnetic fields inherent in or generated by biological objects.

There are known magnetic field gradient measuring devices (gradient meters) of the type that comprises two self-oscillating quantum sensors located at points of a magnetic field which are to be investigated, and connected with their outputs to inputs of a phase detector. Each of the sensors comprises an absorption cell arranged inside a radio frequency coil and filled with atoms of a working matter. Said atoms of said working matter are optically pumped by a light source which is a spectroscopic lamp arranged at the input of the absorption cell. Arranged at the output of said absorption cell is a photocell intended to register the beam of light passing through said cell. The output of the photocell is connected to the input of an amplifier. The radio frequency coil is energized with current of a variable frequency close to the magnetic transition resonance frequency of atoms of the working matter, which is determined by the intensity of the magnetic field at the location of the sensor. In order to supply variable-frequency current to the radio frequency coil, each of the sensors is provided with a feedback circuit which connects the output of the amplifier to the input of the radio frequency coil of that sensor.

In the conventional devices, magnetic field gradients are measured either on the basis of a difference in oscillation frequencies of the sensors, which difference is determined by a difference in the parameters of the magnetic field at the sensors locations, or on the basis of direct current in the feedback circuit, proportional to the difference in the oscillation frequencies. Said direct current is applied to an additional feedback coil of one of the sensors from the output of the phase detector whose inputs are connected to the outputs of both sensors (cf. U.S. Pat. No. 3,252,081, Cl. 324-5).

Gradient meters of the above type can measure great magnetic field gradients with a sufficient degree of accuracy at small base distances. However, measurements of small magnetic field gradients at small base distances involve difficulties due to the effects of one sensor upon the other. One of the sensors acquires the oscillation frequency of the other sensor, which is a serious obstacle to effective magnetic field gradient measurements.

In case of a gradient meter which registers differences in the sensor's frequencies, the effectiveness of filtering the output signal depends upon the value of the magnetic field gradient, i.e. upon the difference in the frequencies. A decreasing magnetic field gradient makes it increasingly difficult to filter the output signal, which results in a narrowing frequency range of measurements.

Conventional magnetic field gradient measuring devices of the type that incorporates a d.c. feedback circuit provide for a sufficiently high accuracy of measurements only in the absence of mechanical displacements of the feedback coil. At the same time gradient meters of this type are ineffective in measuring magnetic field gradients at small base distances due to the effects of scattering of the magnetic field of the feedback coil upon the reference sensor.

Besides, conventional gradient meters lack means to eliminate noise generated by electric networks, which results in a reduced noise immunity in the course of measurements.

It is an object of the present invention to provide a magnetic field gradient measuring device which would make it possible to measure small gradients.

It is another object of the invention to provide a magnetic field gradient measuring device which would make it possible to measure magnetic field gradients at small base distances.

It is still another object of the invention to provide a magnetic field gradient measuring device featuring a high noise immunity and a high vibration resistance.

The present invention essentially consists in providing a magnetic field gradient measuring device (gradient meter) comprising two sensors to be arranged at points of a magnetic field which are to be investigated, and connected with their outputs to inputs of a phase detector, each of the two sensors comprising an absorption cell filled with atoms of a working matter, at whose input there is arranged a light source intended for optical pumping of atoms of the working matter, whereas arranged at the output of the absorption cell is a photocell intended to register the beam of light passing through the cell arranged inside a radio frequency coil energized with current of a variable frequency close to the magnetic transition resonance frequency of atoms of the working matter, determined by the intensity of the magnetic field at the sensor locations, which device includes, according to the invention, a means for supplying variable-frequency current to the radio frequency coils of both sensors.

It is expedient that the function of the means for supplying variable-frequency current to the radio frequency coils should be used by a variable-frequency oscillator.

The means for supplying variable-frequency current to the radio frequency coils may be a feedback circuit provided in one of the sensors, the parameters of the feedback circuit being selected so as to ensure a phase balance and a resonance frequency amplitude balance in the feedback circuit, which circuit is to be electrically connected to the input of the radio frequency coil of the other sensor.

It is desirable that the function of the means for supplying variable-frequency current to the radio frequency coils should be performed by an additional sensor indentical with the first two sensors and provided with a feedback circuit whose parameters are selected so as to ensure a phase balance and a resonance frequency amplitude balance, which circuit is electrically connected to the inputs of the radio frequency coils of the first two sensors.

In the latter case it is expedient that the device should include a frequency (phase) detector connected to the output of the additional sensor, and a filter tuned to the frequency of noise to be compensated and connected with its input to the output of the frequency (phase) detector, whereas the output of the filter is connected to the input of the radio frequency coil of the additional sensor and, via a signal level regulator, to the inputs of the radio frequency coils of the first two sensors.

The gradient meter of the present invention makes it possible to measure small (in the order of $10^{-8}$ gausses) magnetic field gradients.

The effects of one sensor upon the other at small base distances are ruled out due to the fact that the proposed device operates at a single frequency coherent for all the sensors, the effectiveness of filtering the output signal of the gradient meter is not affected by the value of the magnetic field gradient, which value may be close to half the width of the magnetic resonance line.

The proposed gradient meter features a high immunity to noise generated by electric networks, and a high vibration resistance.

The invention will be better understood from the following detailed description of preferred embodiments thereof to be read in conjunction with the accompanying drawings, wherein.

Figure 1:
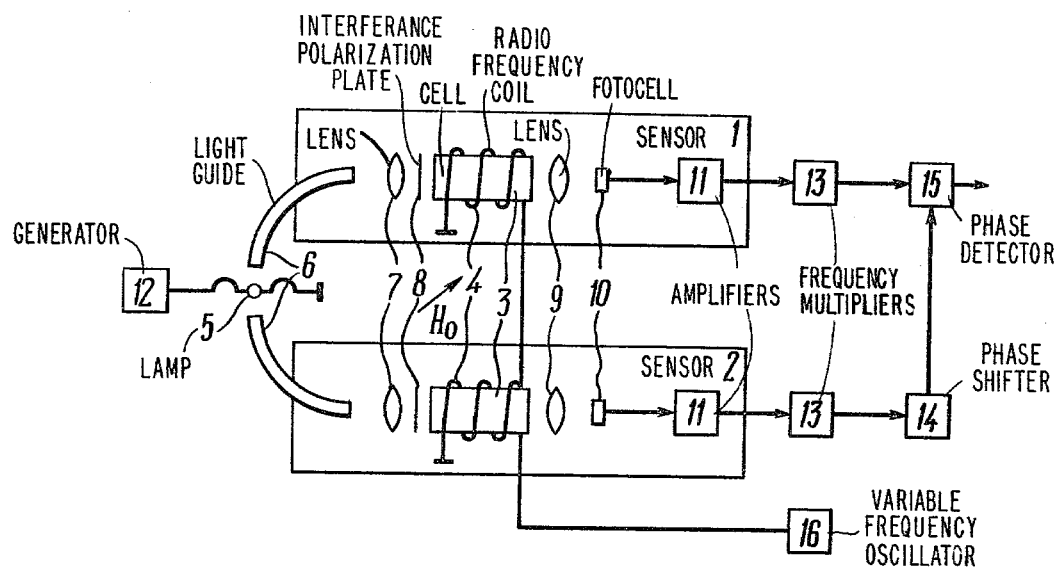
FIG. 1 is a block diagram of a magnetic field gradient measuring device, wherein the means for supplying variable-frequency current to the radio frequency coils is a variable-frequency oscillator.

Referring to the attached drawings, the proposed magnetic field gradient measuring device (gradient meter) comprises two identical sensors 1 and 2 (FIG. 1). Each of the sensors 1 and 2 comprises an absorption cell 3 filled with saturated vapour of an alkali metal, for example, cesium, and provided with means to prevent relaxation of atoms of the working matter. The cell 3 is arranged in a radio frequency coil 4. The beam of light emitted by a spectroscopic lamp 5 performing the function of a light source travels through a light guide 6, a lens 7 and an interference polarization plate 8 to the input of the cell 3. Arranged at the output of the cell 3, downstream of the beam of light, are a lens 9 and a photocell 10 connected with its output to the input of an amplifier 11. The spectroscopic lamp 5 is powered by a generator 12.

The outputs of the amplifiers 11 are the outputs of the sensors 1 and 2 and are connected to inputs of respective frequency multipliers. The output of the frequency multiplier 13 connected to the output of the sensor 2 is coupled via a phase shifter 14 to an input of a phase detector 15. The output of the frequency multiplier 13 connected to the output of the sensor 1 is directly connected to another input of the phase detector 15.

The frequency multipliers 13 are conventional devices built around, for example, an automatic phase frequency control circuit. The known frequency multipliers may be complemented with units intended to stabilize the output signal phase with respect to the input signal phase.

The radio frequency coils 4 of both sensors 1 and 2 are supplied with variable-frequency current by a common means connected with its output to the inputs of the radio frequency coils 4. In the embodiment of FIG. 1, said means is a variable-frequency oscillator 16. The frequency of the oscillator 16 is selected so as to be close to the magnetic transition resonance frequency of atoms of the working matter determined by the intensity of the magnetic field at the points the transmitters 1 and 2 are located.

Said sensors 1 and 2 are mounted on a common rigid base (not shown in FIG. 1) and spaced at a distance of a few centimeters to several meters, depending on the purpose of magnetic field gradient measurements.

Figure 2:
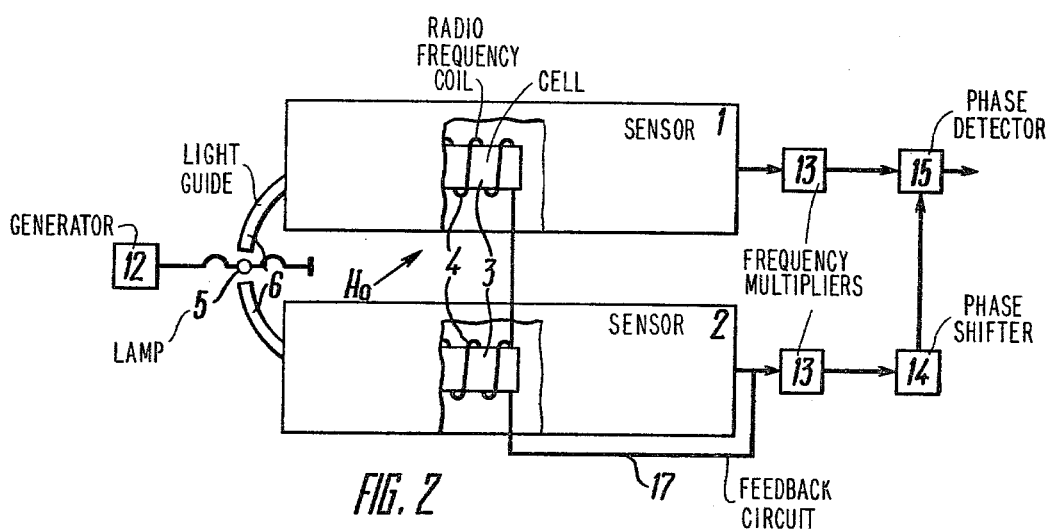
FIG. 2 is a block diagram of a magnetic field gradient measuring device, wherein the means for supplying variable-frequency current to the radio frequency coils is a feedback circuit provided in one of the sensors.

FIG. 2 is a block diagram of another embodiment of the proposed device. Unlike the device of FIG. 1, the means for supplying variable-frequency current to the radio frequency coils 4 is a feedback circuit 17 provided in the sensor 2. The parameters of the feedback circuit 17 are selected so as to ensure a phase balance and an amplitude balance at the magnetic transition frequency of atoms of the working matter. The feedback circuit 17 is electrically connected to the input of the radio frequency coil 4 of the sensor 1.

Figure 3:
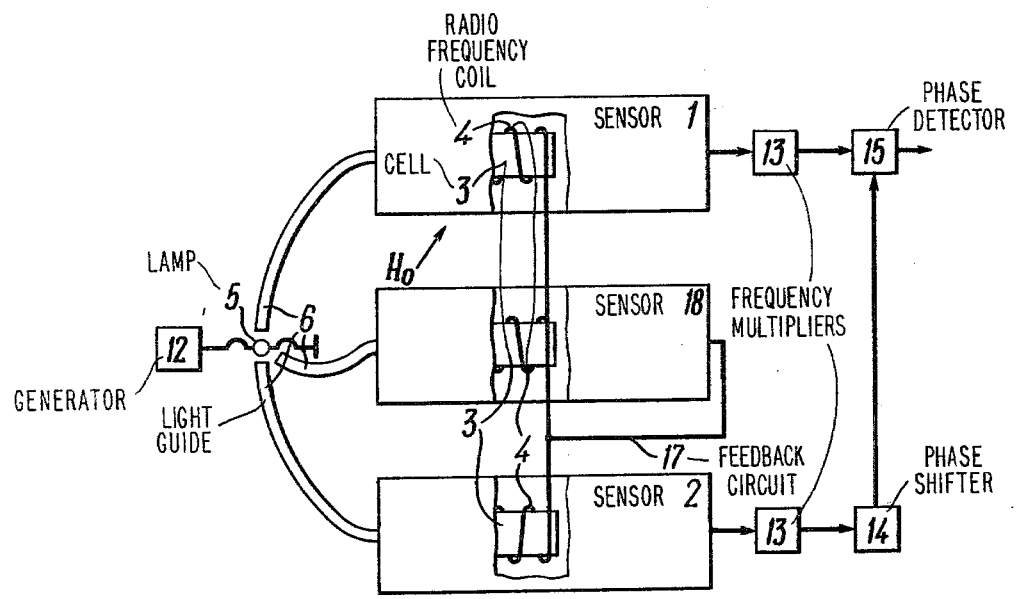
FIG. 3 is a block diagram of a magnetic field gradient measuring device, wherein the means for supplying variable-frequency current to the radio frequency coils is an additional sensor.

Unlike the device of FIG. 1, the means for supplying variable-frequency current to the radio frequency coils 4 of the embodiment of FIG. 3 is a third sensor 18 which is identical to the sensors 1 and 2. The sensor 18 is provided with the feedback circuit 17 whose parameters are selected so as to ensure a phase balance and an amplitude balance at the magnetic transition frequency of atoms of the working matter. The feedback circuit 17 is electrically coupled to the inputs of the radio frequency coils 4 of the sensors 1 and 2.

Figure 4:
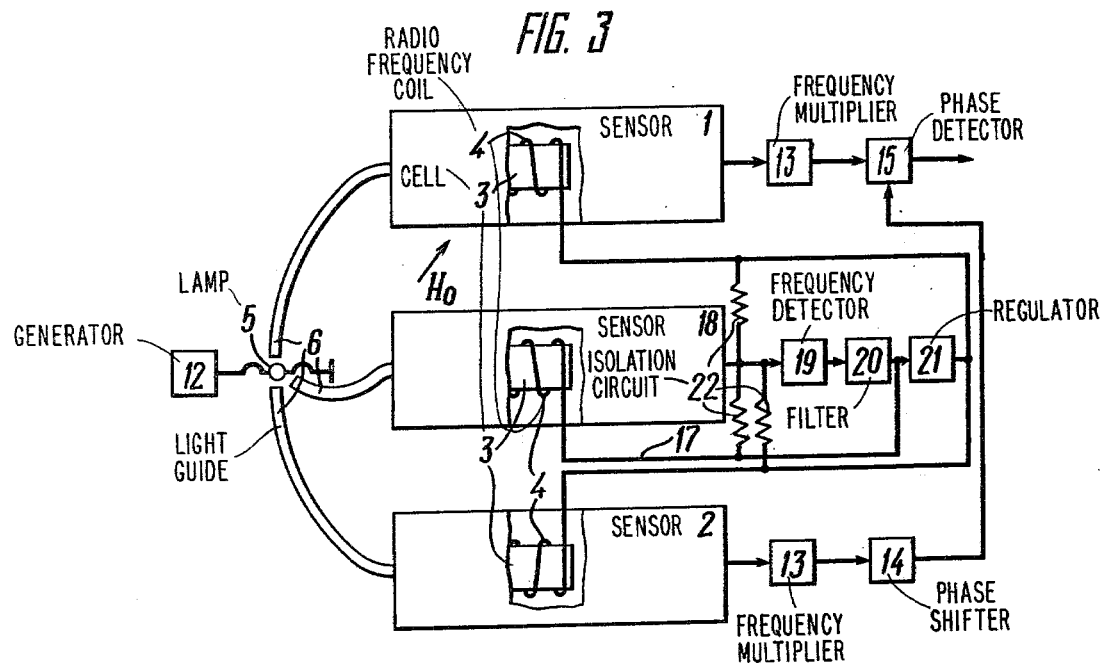
FIG. 4 is a block diagram of a magnetic field gradient measuring device provided with a circuit intended to eliminate electric network noise.

Unlike the device of FIG. 3, the embodiment of FIG. 4 includes a frequency (phase) detector 19 for noise signal separation, connected to the output of the sensor 18.

The output of the frequency (phase) detector 19 is connected via a filter 20, tuned to the noise frequency range to the radio frequency coil 4 of the sensor 18 and via a signal level regulator 21 to the radio frequency coils 4 of the sensors 1 and 2. The output of the sensor 18 is also connected to all of the radio frequency coils 4 via isolation circuits 22, for example, active resistors.

The proposed magnetic field gradient measuring device operates as follows.

As the device is switched on, the high-frequency generator 12 produces a discharge in the spectroscopic lamp 5 (FIG. 1).

The working matter of the spectroscopic lamp 5 is the same as in the absorption cell 3, so in the course of the discharge the spectroscopic lamp 5 emits a beam of light which is in resonance with the atoms contained in the absorption cell 3.

In order to carry out optical pumping of atoms of the working matter in the cell 3, the beam of light of the spectral lamp 5 is directed through the light guides 6, lenses 7 and interference polarization plates 8 which separate a desired resonance radiation line for optical pumping and effect its circular polarization with respect to the absorption cells 3.

The cells 3 containing saturated vapour of an alkali metal, for example, cesium, are filled with a buffer gas to prevent relaxation of atoms of the working matter on the walls of the cells 3 in the course of optical pumping. Another way of preventing relaxation is to coat the walls of the cells 3 with a thin layer of paraffin.

As the radio frequency coils 4 are energized by the variable-frequency oscillator 16, a variable magnetic field is produced in the cells 3.

If the frequency of the oscillator 16 is close to the frequency of transition between the magnetic sublevels of atoms of the working matter, between which the optical pumping produces an inverse population, and if the angle between the direction of the magnetic field $H_o$ and the axis of the beam of light in the cells 3 is close to 45°, the beam of light that passes through the cells 3 is amplitude-modulated. The maximum of modulation corresponds to the equality between the frequency of the variable-frequency oscillator 16 and that of magnetic transition.

Upon passing through the cells 3, the amplitude-modulated beam of light is detected by the photocells 10 and amplified.

In the absence of a magnetic field gradient, the phase shift of signals at the outputs of the identical sensors 1 and 2 is zero. The presence of a gradient $\Delta H$ accounts for a phase shift $\Delta \phi$ related to the magnetic field gradient as follows:

$$\Delta \phi \approx \frac{g0° \cdot \Delta H \cdot A}{\Delta f} \text{ degrees,}$$

where A is an atom constant, whereby the magnetic transition frequency is related to the magnetic field intensity; and $\Delta f$ is the width of the magnetic transition line, which is dependent upon the transverse relaxation time of atoms in the cells 3 and the intensity of the pumping light.

The phase shift $\Delta \phi$ is measured by the phase detector 15. In order to improve the resolution of the device, signals from the sensors 1 and 2 are applied to said phase detector 15 via the identical frequency multipliers 13.

Normal operation of the phase detector 15 requires a certain phase shift between signals applied to its inputs. This shift is determined by the phase shifter 14.

The gradient meter of FIG. 1 makes it possible to measure small gradients with small distances between the sensors. However, high effectiveness requires the presence of a magnetic field which would be stable with time, and a low level of variable magnetic noise which causes amplitude noise modulation of sensor signals.

In order to measure the gradient of a magnetic field that varies with time, it is more convenient to use the gradient meter of FIG. 2, wherein the means for supplying variable-frequency current to the radio frequency coils 4 is the feedback circuit 17 provided in the sensor 2 and connected to the input of the radio frequency coil 4 of the sensor 1. The parameters of the feedback circuit 17 are selected so as to ensure a phase balance and a resonance frequency amplitude balance; as a result, the sensor 2 operates in the self-oscillation mode, its oscillation frequency following variations in the external magnetic field, whereby normal functioning of the sensor 1 is ensured.

The gradient meter of FIG. 2 makes it possible to measure gradients of magnetic fields which vary with time; however, this gradient meter is sensitive to variable magnetic noise that causes amplitude noise modulation of signals of the transmitters 1 and 2.

In order to measure magnetic field gradients in the presence of magnetic noise, it is preferable that use should be made of the gradient meter shown in FIG. 3.

In the embodiment of FIG. 3, the function of the means for supplying variable-frequency current to the radio frequency coils 4 is performed by the sensor 18 provided with the feedback circuit 17 which connects the output of said sensor 18 to the radio frequency coils 4 of all the three sensors 1, 2 and 18. The parameters of the feedback circuit 17 of the sensor 18 are selected so as to ensure a phase balance and a resonance frequency amplitude balance; as a result, the sensor 18 operates in the self-oscillation mode, its oscillation frequency following variations in the intensity of the external magnetic field, which automatically ensures normal functioning of the sensors 1 and 2.

The permissible gradient of the magnetic field between the three sensors 1, 2 and 18 must be of a value at which the self-oscillation frequency of the sensor 18 should be found within the interval between the resonance frequencies of the sensors 1 and 2.

The gradient meter of FIG. 3 makes it possible to measure gradients of magnetic fields which vary with time at variable magnetic noise levels that are commensurable, in terms of magnetic units, with the width of the magnetic transition line.

If the magnetic noise level is higher, for example, because of the presence of electric networks, the best accuracy of measurements is provided by the gradient meter of FIG. 4.

The device of FIG. 4 includes a frequency (phase) detector 19 intended for noise separation and connected to the output of the sensor 18. The frequency detector 19 may have different circuitries; one of the possible versions is an automatic phase frequency control circuit operating as a narrow-band follow filter. An error signal is applied from the output of a phase detector, incorporated in the above-mentioned automatic phase frequency control circuit, to the filter 20 tuned to the noise frequency.

The output signal of the filter 20 is applied to the radio frequency coil 4, whereby in the cell 3 of the sensor 18 there is produced a magnetic field which is in anti-phase which the magnetic field of the noise; thus the noise is compensated.

In the sensor 18, the degree of noise suppression is determined by the transfer factor K of the feedback circuit from the frequency detector 19 to the radio frequency coil 4. The same noise, acting upon the sensors 1 and 2, is compensated by the magnetic field at the noise frequency by connecting the radio frequency coils 4 to the output of the filter 20 via the signal level regulator 21. If the intensity of the magnetic compensation field is equal to half the sum total of the intensities of the noise fields acting upon the sensors 1 and 2, any change in the events can be detected at the output of the device.

The noise suppression circuit of the sensor 18 reduces the noise signal (K+1)-fold. If similar circuits are introduced in the sensors 1 and 2, the noise gradient is reduced accordingly, which makes it unnecessary to adjust the noise compensation level.

The gradient meter of FIG. 4 makes it possible to measure gradients of magnetic fields varying with time at levels of variable magnetic noise which are in excess, in terms of magnetic units, of the width of the magnetic transition line.

What is claimed is:

1. A magnetic field gradient measuring device comprising a first sensor located at a first point of said magnetic field; a second sensor located at a second point of said magnetic field; an absorption cell in each of said sensors; atoms of a working matter filling said absorption cell; a light source in each of said sensors, arranged at the input of said cell and intended for optical pumping of said atoms of said working matter; a photocell in each of said sensors, arranged at the output of said cell and intended to receive the beam of light upon its passage through said cell; a radio frequency coil in each of said sensors, the axis of said radio frequency coil being parallel with that of the beam of light, said coil encompassing said cell; a means for energizing said radio frequency coils with current of a variable frequency close to the magnetic transition resonance frequency of said atoms of said working matter determined by the intensity of the magnetic field being investigated at the point of location of the respective sensor, said means being connected with its output to the inputs of said radio frequency coils; amplifiers, each connected to the output of one of said photocell; a phase detector connected with its input to outputs of said amplifiers.

2. A magnetic field gradient measuring device as claimed in claim 1, wherein said means for supplying variable-frequency current to said radio frequency coils is a variable-frequency oscillator.

3. A magnetic field gradient measuring device as claimed in claim 1, wherein said means for supplying variable-frequency current to said radio frequency coils is a feedback circuit provided in one of said sensors, the parameters of said feedback circuit being selected so as to ensure a phase balance and a resonance frequency amplitude balance in said feedback circuit which is electrically connected to the input of said radio frequency coil of said sensor.

4. A magnetic field gradient measuring device as claimed in claim 1, wherein said means for supplying variable-frequency current to said radio frequency coils is a third sensor identical to said first and second sensors and provided with a feedback circuit whose parameters are selected so as to ensure a phase balance and a resonance frequency amplitude balance, which circuit is electrically connected to the inputs of said radio frequency coils of said first and second sensors.

5. A magnetic field gradient measuring device as claimed in claim 4, provided with a frequency detector connected to the output of said third sensor, and with a filter tuned to the frequency of the noise to be compensated, said filter being connected with its input to the output of said frequency detector, whereas the output of said filter is connected to the input of the radio frequency coil of said third sensor and, via a signal level regulator, to the inputs of said radio frequency coils of said first and second sensors.

6. A magnetic field gradient measuring device comprising: two absorption cells located at two points of a magnetic field being measured, each of said cells containing quantum systems comprised of: magnetic resonance lines overlapping by at least a half-width of said lines; a common light source to produce optical pumping of said quantum systems; means for guiding optical radiation from said light source to said cells; means to circularly polarize said optical radiation; coils for creating a variable resonant magnetic field in each of said cells, whereby the optical radiation passing through said cells becomes amplitude modulated within a resonance line; means for converting the modulated radiation intensity of said cells into variable electric signals; a phase detector for comparing the phases of said variable electric signals, whereby the output signal of said phase detector is functionally related to the Earth's magnetic field gradient between cell locations; and a common means for energizing said coils with a variable resonance current.

* * * * *